United States Patent [19]

Christian et al.

[11] Patent Number: 4,864,457
[45] Date of Patent: Sep. 5, 1989

[54] METHOD AND DEVICE FOR CONTROLLING AN ELECTROMAGNET WHOSE ENERGIZATION, BY MEANS OF AN AC CURRENT, CAUSES ENGAGEMENT OF TWO PARTS

[75] Inventors: Bataille Christian, Ville D'Avray; Belbel Elie, Epinay sur Seine; Jean-Noël Gast, Rueil Malmaison; Lauraire Michel, Courbevoie, all of France

[73] Assignee: La Telemecanique Electrique, France

[21] Appl. No.: 162,386

[22] PCT Filed: May 20, 1987

[86] PCT No.: PCT/FR87/00167
  § 371 Date: Jan. 19, 1988
  § 102(e) Date: Jan. 19, 1988

[87] PCT Pub. No.: WO87/07427
  PCT Pub. Date: Dec. 3, 1987

[30] Foreign Application Priority Data

May 21, 1986 [FR] France ............................. 86 07190

[51] Int. Cl.$^4$ .......................................... H01H 47/28
[52] U.S. Cl. ................................. 361/153; 361/187
[58] Field of Search ............... 323/235, 319; 361/6, 361/187, 153, 154

[56] References Cited

U.S. PATENT DOCUMENTS 3,557,381  1/1971  Henry ................................. 323/319
4,461,990  7/1984  Bloomes ............................. 323/325

Primary Examiner—L. T. Hix
Assistant Examiner—David M. Gray
Attorney, Agent, or Firm—William A. Drucker

[57] ABSTRACT

The invention provides a device for controlling an electromagnet having a coil (L) connected to an AC supply source, through a switch (T) controlled by a control circuit.

This control circuit comprising a member for determining the voltage zeros of the AC current ($R_4$, $C_3$, $D_3$, $IN_1$, $C_4$, $R_6$, $IN_2$), a delay element adjusted for obtaining a delay time which corresponds to the privileged control angle of the electromagnet and a switch-over device (FL) controlled by the delay element for delivering to the switch (T), following a control order, a control signal delayed by said delay time. The invention applies particularly to contactors and electromagnetic valves.

13 Claims, 3 Drawing Sheets

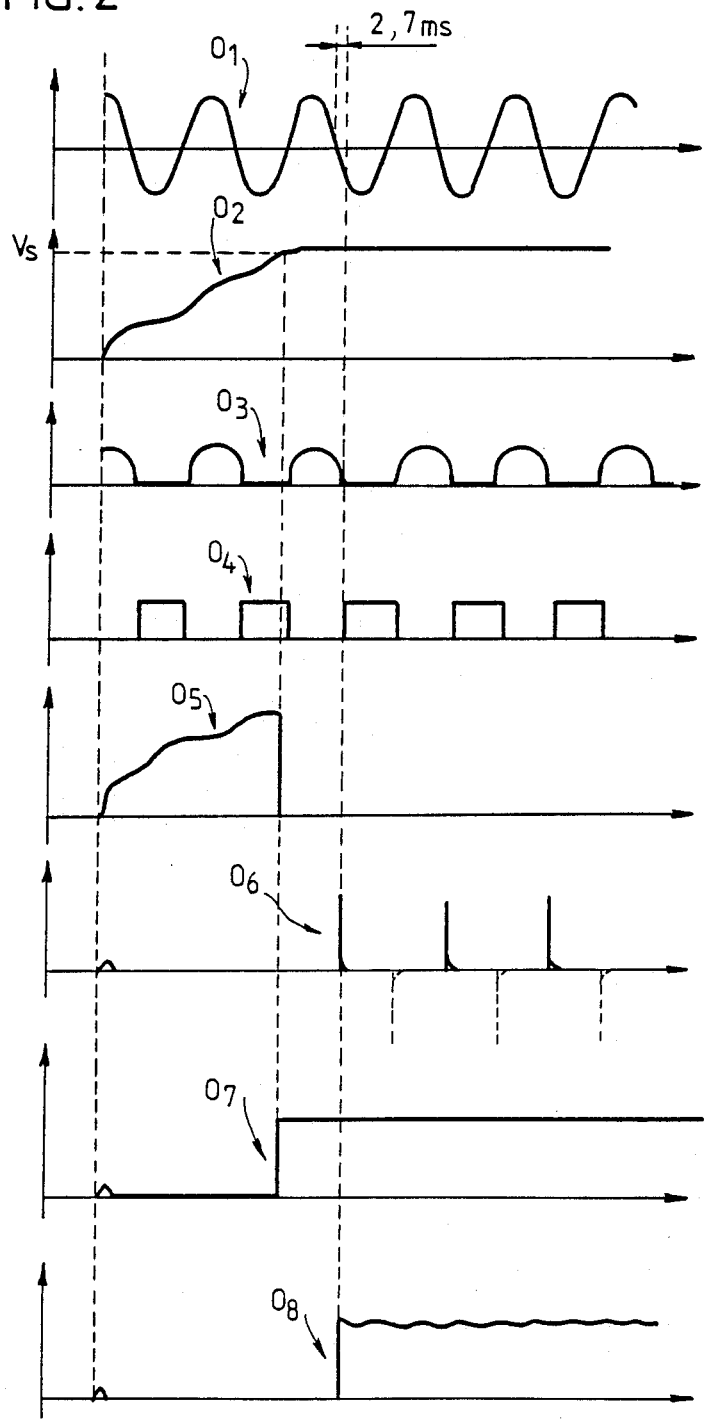

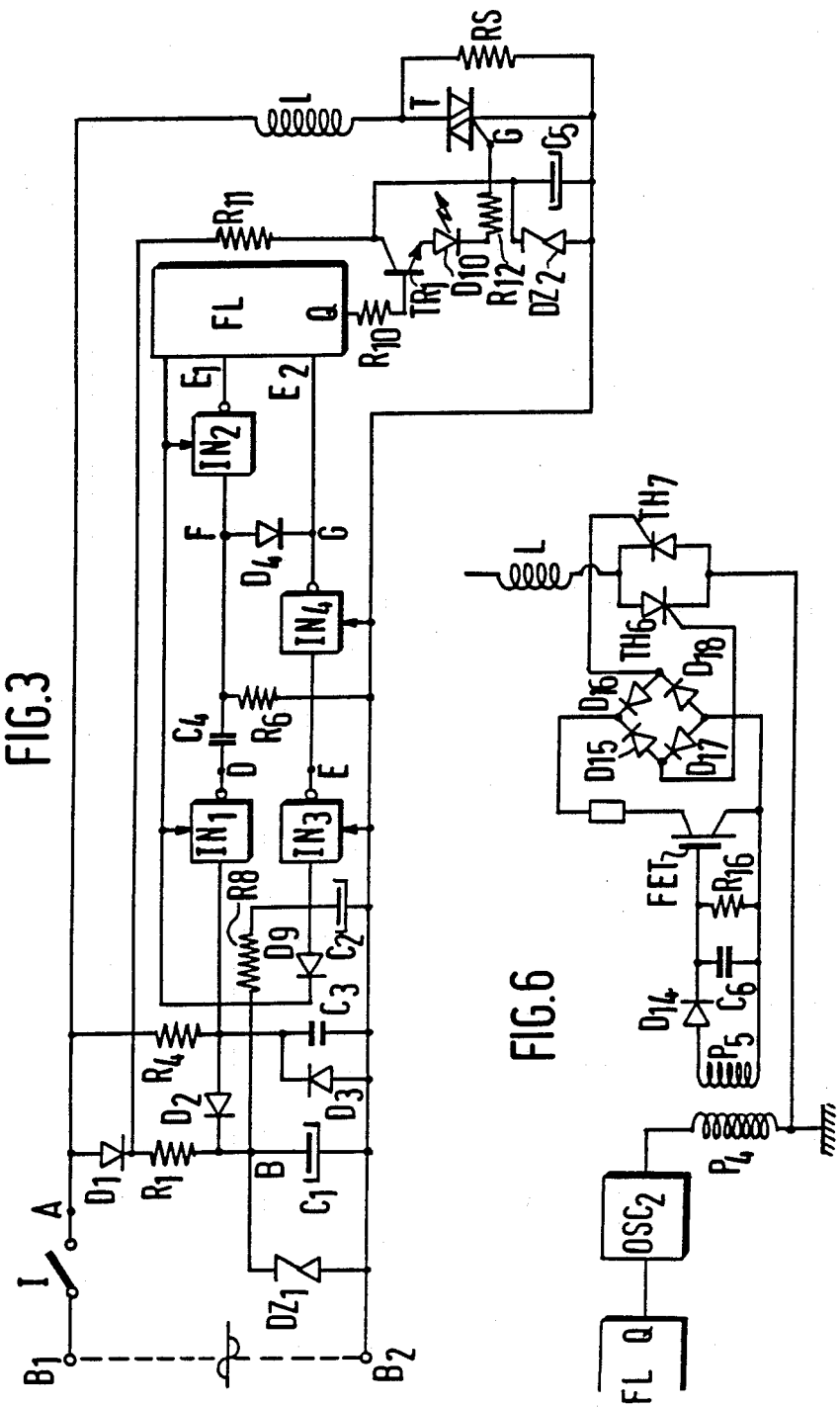

METHOD AND DEVICE FOR CONTROLLING AN ELECTROMAGNET WHOSE ENERGIZATION, BY MEANS OF AN AC CURRENT, CAUSES ENGAGEMENT OF TWO PARTS

The present invention relates to a method and device for controlling an electromagnet whose energization, by means of a AC current, causes engagement of two parts.

It applies more particularly to the control of electromagnets used in electric contactors whose closure is caused following energization of the coil of the electromagnet by an AC current, such energization causing the application of the mobile contacts of the contactor on the fixed contacts. However, the invention is not limited to this type of application. It may, in fact, be suitable for numerous other devices actuated by an electromagnet such, for example, as electromagnetic valves.

In devices of this kind, the mechanical energy communicated to the mobile part of the electromagnet for causing closure is variable depending on the closure angle of the switch which controls the energization of the coil of the electromagnet, that is to say depending on the time marking the beginning of the energization, considered in the corresponding period of the AC current.

This is why, at the present time, electromagnets are dimensioned so as to make them operational in all cases, including for the most unfavorable closure angles.

However, besides the increase in cost and size which this dimensioning involves, these measures have a certain number of drawbacks due mainly to the excess of energy developed particularly when the closure angle is favorable.

It has been been discovered in fact that, because of this extra energy, there often occurs in the contactors a brutal impact of the mobile contacts on the fixed contacts which is accompanied by bouncing causing premature wear. Furthermore, the mobile contact assembly and/or the armature of the electromagnet strike the fixed part of the electromagnet at high speed, which causes bouncing of the magnetic circuit (crunching), hammering, even rupture of the magnetic circuit, as well as considerable noise.

Similar problems also arise in other electromagnetic devices such as electromagnetic valves which are then the seat of premature wear of the seals and of more pronounced bouncing phenomena due, in particular, to the resilience of said seals.

The purpose of the invention is therefore to overcome these drawbacks. For this, it is based on the discovery that an electromagnet of said type has at least one privileged closure angle leading to optimum actuation of the mobile assembly associated with the electromagnet. Consequently, by imposing this privileged closure angle, it becomes possible to overcome the above mentioned drawbacks.

To reach this result, the invention provides a method for controlling an electromagnet including a coil to which may be applied an AC current following the emission of a control order, to causing the engagement of two parts, this method being more particularly characterized in that it includes the following steps:

previous determination of a period of time which corresponds to a privileged energization control angle of the electromagnet;

detection, from the moment when said control order has been emitted, of a zero cross-over of the AC current;

the application, of the AC current to the coil, when said period of time following after said zero cross-over has elapsed.

This method may be used by associating, with a controllable switch device in series with the coil of the electromagnet, a relatively simple electronic circuit comprising:

a member for determining the voltage zero of the AC current;

a delay element connected to the output of the zero determination member, this delay element being adjusted so as to obtain a delay time which corresponds to the privileged control angle of the electromagnet;

a switch-over device controlled by said delay element for delivering to the switch device, following a control order, a signal for controlling energization of the coil delayed by said delay time.

The control thus obtained of the speed communicated to the mobile contact assembly and/or to the mobile armature avoids the above mentioned drawbacks.

Tests carried out on such devices have shown that it is possible to multiply up to ten the lifespan of the apparatus and, on the other hand, to considerably reduce the volume and the price of the electromagnet, because more especially of the reduction of the volume of copper required.

Embodiments of the invention will be described hereafter, by way of non limitative examples, with reference to the accompanying drawings in which:

FIG. 2 is a diagram representative of the electric signals at different points of the circuit shown in FIGS. 1 and FIGS. 3, 4, 5 and 6 are diagrams of variants of construction of the controllable switch used in the devices shown in FIG. 1 and 2.

Figure 1:
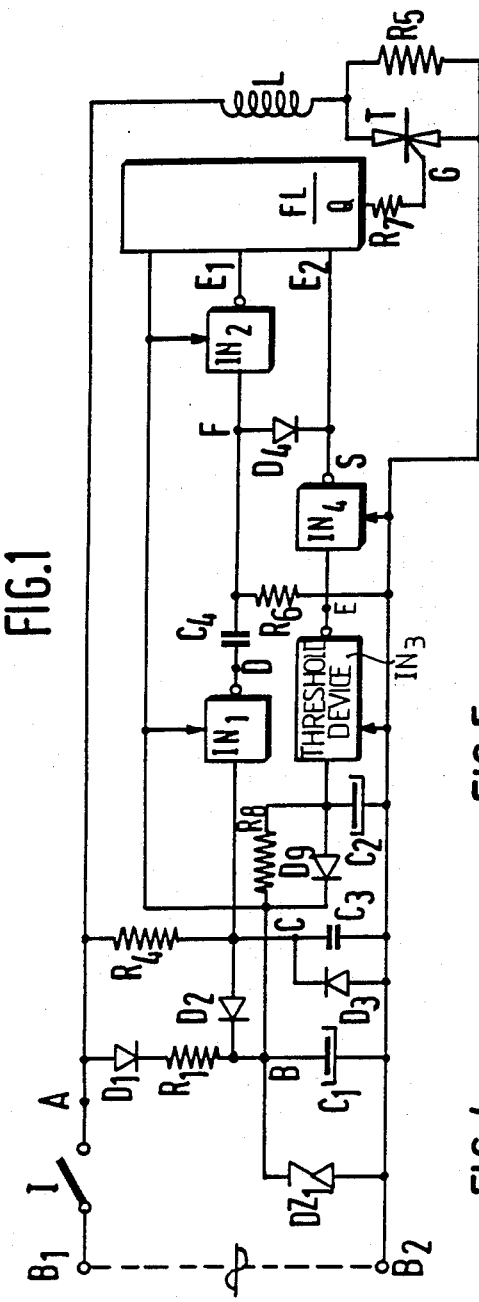
FIG. 1 is the general diagram of a control device in accordance with the invention.

Such as shown in FIG. 1, the control device for an electromagnet of which only the coil L has been shown comprises, in series in a circuit connecting the coil L to the terminals of an AC source (terminals $B_1$, $B_2$), a control switch I whose closure is caused by application of an order for energizing the coil, and a controllable switch formed by a triac T shunted, in a conventional way, by a resistor RS ("Snubber") intended to avoid untimely triggering by dV/dt of the Trian T when the control switch I is closed.

The gate G of this Triac T is controlled by an electronic control circuit fed by a supply circuit connected between the output terminal A of switch I and terminal $B_2$ of the source.

This supply circuit includes more particularly, in series, a diode $D_1$, a resistor $R_1$ and a capacitor $C_1$ shunted by a Zener diode $Dz_1$.

In this example, detection of the zeros of the voltage of the source and said delay time defining the privileged control angle of the electromagnet are obtained using a procedure including the following steps:

the provision of a half-wave rectified current synchronous with the AC current of the source but phase shifted with respect thereto by a phase shift angle corresponding to the privileged control angle;

shaping of said rectified current into a square wave signal having the same frequency characteristics, and in phase opposition;

shunting of the square wave signal so as to obtain pulses corresponding to the rising fronts of said signal;

control of the gate G of the Triac T by means of a bistable flip-flop responsive to said pulses.

Thus, in the example shown, the phase for obtaining the rectified current is achived by means of a rectifier circuit including, between the terminals A and $B_2$, a resistor $R_4$ and a diode $D_3$ in parallel with which is connected a capacitor $C_3$. The phase shift of the rectified half-wave current obtained at point C with respect to the AC current of the network may be adjusted to the desired value, by an appropriate choice of the value of resistor $R_4$ and/or of the capacitor $C_3$. This phase shift can be seen in the oscillograms $O_1$ and $O_3$ shown in FIG. 2 which show respectively the voltage of the AC current taken at terminal A and the rectified half-wave voltage obtained at point C (junction between resistor $R_4$ and capacitor $C_3$).

The half-wave rectified voltage is applied to a first inverting shaper $IN_1$ which delivers at a point D a synchronous square wave signal but in phase opposition, shown by the oscillogram $O_4$. This signal is then applied to a shunting device formed, conventionally, by a capacitor $C_4$ and a resistor $R_6$. At point F, situated at the junction of capacitor $C_4$ and resistor $R_6$, a succession of pulses is obtained which correspond respectively to the rising fronts of the square waves of the signal delivered by the inverting shaper $IN_1$.

These pulses, shown in the oscillogram $O_6$, are then applied to a second inverting shaper $I_2$ whose output is connected to the input $E_1$ of a bistable flip-flop FL of type RS. The Q output of this flip-flop FL, whose signal is represented by the oscillogram $O_8$, is connected to the gate of Triac T through a resistor $R_7$.

The initialization input $E_2$ of flip flop FL is connected to an initialization circuit adapted so as to output an initialization signal only when, following the closure of switch I, the supply voltage exceeds a predetermined value. This initialization circuit includes more particularly, between point B of the supply circuit and terminal $B_2$, a resistor $R_8$ in series with a capacitor $C_2$. The junction point between this resistor $R_8$ and this capacitor $C_2$ is then connected to a threshold device $IN_3$ which delivers at its output E a voltage whose variation has been shown by the oscillogram $O_5$ and which comprises, following closure of switch I, a first phase during which the voltage increases to the image of the supply voltage at point B (oscillogram $O_2$) and a second phase which is initiated when the voltage reaches a predetermined threshold VS, and during which this voltage has a zero value.

The output E of the threshold device $IN_3$ is connected to the input of an inverting shaper $IN_4$ which delivers at its output S an output voltage which, as can be seen from oscillogram $O_7$, has a zero value (logic state 0) in the first phase of operation of the threshold device $IN_3$ and a value corresponding to a logic state 1 during the second phase. This output voltage is applied to the initialization input $E_2$ of flip flop FL. Thus, the initialization of flip-flop FL is delayed, which avoids uncertain operation of the flip-flop during the transitory phase which follows closure of switch I.

A diode $D_4$ connected between point F (output of the shunting device $C_4$ $R_6$) and point S prevents triggering of the flip-flop FL during the whole time that the initialization, which must take place during closure of switch I, is not finished (diode $D_4$ maintains the output of the shunting device $C_4$ $R_6$ at zero voltage during the first operating phase of the threshold device $IN_3$ and of the inverting shaper $IN_4$).

The above described circuit further comprises:

a diode $D_2$ connecting points B and C together so as to limit the voltage at point C to the supply voltage delivered at point B;

a diode $D_9$, in parallel across resistor $R_8$, which serves for accelerating the discharge of capacitor $C_2$ at the time of opening of switch I.

It should be noted that in the oscillograms shown in FIG. 2 the delay time corresponding to the privileged control angle of the electromagnet has been chosen at about 2.7 ms, which corresponds to an angle of 50°.

Of course, the invention is not limited to this angle. In fact, depending on the electromagnet device used, this angle may vary from 0° to 180°.

In the variant shown in FIG. 3, the gate current of the Triac is amplified by a transistor $TR_1$ whose base is connected to the Q output of flip-flop FL, through a resistor $R_1$. The collector of this transistor $TR_1$ is connected to diode $D_1$ through a resistor $R_{11}$ and to the terminal $B_2$ of the AC source through a capacitor $C_5$ shunted by a Zener diode $Dz_2$. The emitter of transistor $TR_1$ is then connected to the trigger of Triac T through a resistor $R_{12}$ and a light emitting diode $D_{10}$ which allows the state of control of Triac T to be displayed.

It should be noted that control of the electromagnet could be provided otherwise than by means of a triac.

Figure 4:
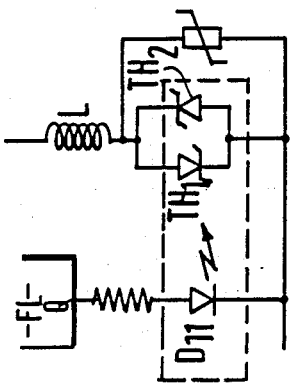

Thus, FIG. 4 shows one embodiment in which this control is provided by means of an opto-coupler which may comprise, in a way known per se, a light emitting diode $D_{11}$, connected in the output circuit of flip-flop FL and two optothyristors $TH_1$, $TH_2$ connected head to tail in the circuit of coil L.

Figure 5:
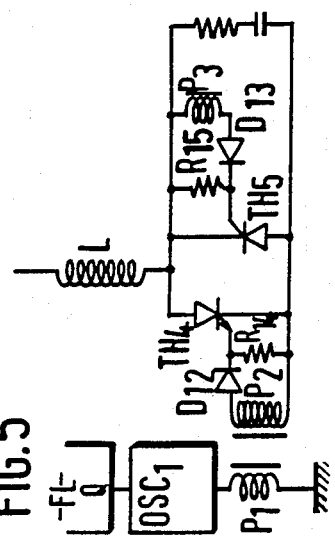

FIG. 5 shows another variant in which the bistable flip-flop FL causes the actuation of an oscillator or of a multivibrator $OSC_1$ whose output feeds into the primary $P_1$ of a transformer. This latter than has two secondary windings $P_2$, $P_3$ driving two respective thyristors $TH_4$, $TH_5$ connected head to tail in the circuit of coil L of the electromagnet through two demodulators including a diode $D_{12}$, $D_{13}$ and a resistor $R_{14}$, $R_{15}$.

Another solution, shown in FIG. 6, consists in using a coreless transformer having a single secondary winding whose primary $P_4$ is connected in the output circuit of an oscillator $OSC_2$ driven by the bistable flip-flop FL. The voltage at the terminals of the secondary winding $P_5$ is then rectified and filtered ($D_{14}$, $C_6$, $R_{16}$), then applied to the gate of a field effect transistor FET. This field effect transistor FET controls two thyristors connected head to tail $TH_6$, $TH_7$ in the circuit of the coil, through a diode bridge $D_{15}$ to $D_{18}$.

The above described method and device have proved to be particularly advantageous for controlling contactors used in inverter circuits.

In fact, these circuits usually include two contactors with reverse operation, that is to say that closure of one of these contactors is accompanied by opening of the other contactor.

Now, in these circuits, in which the respective opening and closing of the two contactors take place simultaneously, there is a considerable risk of short circuiting due to the fact that switch-over to the contactor receiving the closure order occurs before extinction of the arc which occurs at the contacts of the contactor receiving the opening order. Thus, for example in the case of an inverter circuit fr a single phase current, the phase circuit is connected directly to neutral.

This danger is overcome through using, for each of the contactors of the inverter circuit, a control device in accordance with the invention. In fact, with such control devices, switch-over of the contactor urged to closure will always be delayed with respect to the switch-over of the contactor urged to opening, with a delay time greater than the extinction time of the arc of this latter contactor, owing to the time required for initialization.

We claim:

1. A method for controlling an electromagnet including a coil to which may be aplied an AC current coming from a source following the emission of an energization order, for causing the engagement of two parts of this electromagnet, wherein it includes the following steps of:
   i. determining a period of time which corresponds to a privileged energization control angle of the elecromagnet;
   ii. detecting from the moment when said control order has been emitted, of one particular zero cross-over of the AC voltage from the source;
   iii. applying continuously the AC current to the coil, when said period of time following after said zero cross-over has elapsed.

2. Method according to claim 1, wherein the detecting step, said zero cross over and the determining step are obtained including the following steps of:
   i. providing a half-wave rectified current synchronous with said AC current, but phase shifted with respect thereto by a phase shift angle corresponding to the privileged control angle;
   ii. shaping said rectified current into a signal having the same frequency and phase characteristics;
   iii. controlling the application of the AC current to said coil by means of a rising front of said signal.

3. Method according to claim 2, which comprises a step of differentiating the square-wave signal so as to obtain current pulses which coincide in time with the rising fronts of said signal and a step of controlling the application of the AC current to the coil by one of said pulses.

4. Method according to claim 3, which comprises a step of inhibiting said pulses during a transitory period following the emission of the control order.

5. Device for controlling an electromagnet having a coil connected to an AC supply source through a supply circuit controlled by a control switch whose closure is obtained by application of an order for energizing the coil, said supply circuit comprising a controllable switching device in series with said coil and controlled by a control circuit including successively:
   i. a rectifier connected to said supply circuit so as to deliver, when the control switch is closed, a half-wave rectified current synchronous with the AC current of said source, but phase shifted with respect thereto by a phase shift angle corresponding to a privileged control angle of the electromagnet;
   ii. a first shaper for transforming the rectified half-wave current into a square wave signal having the same frequency characteristics and in phase opposition;
   iii. a differentiation network which receives the square wave signal and which delivers pulses coinciding with the rising fronts of the square wave signal;
   iv. a switch over circuit having an input connected to said network so as to receive said impulses and an output connected to a control input of the switching device, said switch-over circuit comprising means for applying on said control input, upon reception of at least one of said impulses, a control signal which causes the switching device to be switched on and therefor, the coil to be energized.

6. Device according to claim 5, which further comprises downstream of said control switch a rectifier circuit for supplying at least said first shaper and said switch over circuit, and means for inhibiting said switch over circuit when the voltage delivered by the rectifier circuit is lower than a predetermined threshold.

7. Device according to claim 6, wherein said switch over circuit comprises a bistable flip-flop having an input connected to said network and an output circuit connected to said switching device and said inhibiting means comprises a threshold device which delivers an initialization signal to said bistable flip-flop when the voltage delivered by the rectifier circuit exceeds the said threshold.

8. Device according to claim 7, which further comprises means ($D_4$) for inhibiting said pulses during a transitory phase.

9. Device according to claim 7, wherein said controllable switching device consists of a triac (T) whose gate (G) is controlled by the output circuit of the bistable flip-flop (FL).

10. Device according to claim 7, wherein said controllable switching device includes an optocoupler ($D_{11}$, $TH_1$, $TH_2$).

11. Device according to claim 10, wherein said controllable switching device includes a light emitting diode ($D_{11}$) connected in the output circuit of the bistable flip-flop (FL) and two optothyristors ($TH_1$, $TH_2$) connected head to tail in the circuit of the coil (L).

12. Device according to claim 7, wherein said controllable swith includes an oscillator ($OSC_1$) controlled by the bistable flip-flop (FL), said oscillator having an output connected to the primary ($P_1$) of a transformer, having two secondary windings ($P_2$, $P_3$,) which drive two respective thyristors ($TH_4$, $TH_6$) connected head to tail in the circuit of the coil (L) of the electromagnet through two respective demodulators ($D_{12}$, $R_{14}$, $D_{13}$, $R_{15}$).

13. Device according to claim 7, wherein the controllable switching device includes an oscillator ($OSC_2$) controlled by the bistable flip flop (FL), said oscillator having an output connected to the primary ($P_4$) of a transformer, a rectifier $D_{14}$, $C_6$, $R_{16}$) for rectifying and filtering the voltage delivered by the secondary ($P_2$) of this transformer, a field effect transistor (FET) driven by the voltage thus rectified and filtered, this field effect transistor controlling two thyristors ($TH_6$, $TH_7$) connected head to tail in the circuit of the coil (L) through a diode bridge ($D_{15}$, to $D_{18}$).

* * * * *